(12) United States Patent
Mercer et al.

(10) Patent No.: US 10,594,210 B1
(45) Date of Patent: Mar. 17, 2020

(54) TRANSIENT RESPONSE OPTIMIZATION FOR CHARGE-PUMP-BASED TWO-STAGE POWER CONVERTER

(71) Applicant: DIALOG SEMICONDUCTOR (UK) LIMITED, London (GB)

(72) Inventors: Mark Mercer, Chandler, AZ (US); Karthik Jayaraman, Chandler, AZ (US); Chanchal Gupta, Chandler, AZ (US); Kevin Dowdy, Chandler, AZ (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 0 days.

(21) Appl. No.: 16/387,335

(22) Filed: Apr. 17, 2019

(51) Int. Cl.
*H02M 1/08* (2006.01)
*H02M 3/07* (2006.01)
*H02M 1/00* (2006.01)

(52) U.S. Cl.
CPC ............. *H02M 3/07* (2013.01); *H02M 1/08* (2013.01); *H02M 2001/0048* (2013.01)

(58) Field of Classification Search
None
See application file for complete search history.

(56) References Cited

U.S. PATENT DOCUMENTS

| | | | | |
|---|---|---|---|---|
| 7,173,477 B1* | 2/2007 | Raghavan | ............... | H02M 3/07 327/536 |
| 2008/0079480 A1* | 4/2008 | Utsunomiya | ......... | H02M 3/073 327/536 |
| 2013/0234513 A1* | 9/2013 | Bayer | ..................... | G05F 1/577 307/31 |
| 2014/0268946 A1* | 9/2014 | Liu | ......................... | H02M 3/07 363/60 |
| 2016/0239040 A1* | 8/2016 | Ripley | ..................... | G05F 5/00 |
| 2018/0115246 A1* | 4/2018 | Azrai | .................... | H02M 1/143 |

* cited by examiner

*Primary Examiner* — Jeffrey A Gblende
(74) *Attorney, Agent, or Firm* — Haynes and Boone, LLP

(57) ABSTRACT

A two-stage power converter includes a dual-level driver to control a current conducted by a switch transistor in a charge pump to control the charging of a flying capacitor in the charge pump.

20 Claims, 10 Drawing Sheets

TRANSIENT RESPONSE OPTIMIZATION FOR CHARGE-PUMP-BASED TWO-STAGE POWER CONVERTER

TECHNICAL FIELD

This application relates to power converters, and more particularly to a two-stage converter in which one stage is a charge pump and a remaining stage is a DC-DC switching power converter

BACKGROUND

Wireless charging modes have been developed for the charging of portable devices in which the portable device includes a coil for receiving or transmitting power wirelessly to a coil in an external device. Due to the less-than-ideal coupling between such coils, the portable device requires a relatively high-power supply voltage such as 15 V to energize its coil when transmitting power to another device. But the battery voltage of a mobile device is typically substantially lower voltage such as 4 V. A mobile device thus needs a power converter to boost the battery voltage to the elevated power supply voltage necessary for wireless power transmission.

One choice for such power conversion is a two-stage power converter in which a boost converter boosts the battery voltage to an intermediate voltage that is then doubled by a flying-capacitor-based charge pump. The resulting two-stage power converter has advantageous efficiency and regulation. But during certain modes of operation such as startup and shutdown, the charge pump is not switched but instead has its input shorted to its output such that the charge pump is bypassed. This mode of operation is denoted herein as a bypass mode of operation. During the bypass mode of operation, it is only the boost converter that is driving the output voltage for the two-stage converter. There will thus be a first transition from the bypass mode to a normal mode of operation in which charge pump is active. Similarly, there is a second transition from the normal mode of operation to the bypass mode of operation. In both transitions, the output voltage may have significant overshoot and undershoot of the desired regulated value.

Accordingly, there is a need in the art for charge-pump-based two-stage converters having improved bypass mode transitions.

SUMMARY

A two-stage power converter is disclosed that includes a DC-DC switching power converter input stage (e.g., a boost converter) and a flying-capacitor-based charge pump output stage. In alternative embodiments, the arrangement may be reversed such that the flying-capacitor-based charge pump functions as the input stage and the DC-DC switching power converter functions as the output stage.

The switching power converter stage includes a controller for modulating the switching of the switching power converter to regulate an output voltage for the two-stage power converter. In contrast, the switching of the charge pump stage is open loop with respect to the output voltage. During normal operation, both stages cycle their switch transistors to assist in the power conversion. But in a bypass mode of operation, the charge pump is static such that only the switching power converter cycles its switch transistors to support the output voltage. To assist in the regulation of the output voltage during a transition from bypass mode to normal operation, a switch transistor in the charge pump is controlled to conduct a controlled amount of current to limit the charging of the flying capacitor voltage. For example, in a field-effect transistor (FET) embodiment, the switch transistor conducts the controlled amount of current in the saturation mode. During normal operation, the switch transistors in the charge pump conduct in the triode mode. The resulting control of the flying capacitor voltage improves the regulation of the output voltage during the transitions between the bypass mode and regular operation.

These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A two-stage charge-pump-based power converter is disclosed having improved output voltage regulation during bypass mode transitions. The following discussion is directed to an embodiment in which the DC-DC switching power converter stage is a boost converter. However, it will be appreciated that other types of DC-DC switching power converters such as a buck converter may be readily substituted for the boost converter. The charge pump stage includes a flying capacitor. The following discussion will assume that the flying capacitor is driven by four field-effect switch transistors, but it will be appreciated that additional transistor switches may be utilized. As known in the charge-pump arts, the switch transistors are cycled so that the flying capacitor is alternatively charged and discharged. During normal operation, the switch transistors are driven to be fully-on in a triode mode of conduction. But during a transition from bypass mode to regulator operation, one of the switch transistors is controlled to conduct in a saturation mode instead of the triode mode. The current through the saturation-mode switch transistor is thus controlled to limit the overshoot and undershoot of the output voltage during the bypass mode transition. The same current control can be applied during a transition from normal operation to the bypass mode.

The following discussion will be directed to embodiments in which an input voltage is boosted by the boost converter stage into an intermediate voltage that serves as an input voltage to the charge pump. A controller controls the switching of the boost converter stage to regulate an output voltage from the charge pump. In contrast to the boost converter, the cycling of the switch transistors in the charge pump during normal operation is open loop. In other words, the on-time or period of the cycling for the charge pump switch transistors is not affected by the output voltage. This open-loop timing for the cycling of the switch transistors continues during the transition but the current is controlled for the saturation-mode operation of one of the switch transistors to limit the overshoot and undershoot of the output voltage. Although the following discussion is directed to embodiments in which the boost converter receives an input voltage, the inventive control discussed herein is readily applied to embodiments in which the charge pump receives the input voltage and steps it down to an intermediate voltage that is then further reduced by a buck converter.

Figure 1:
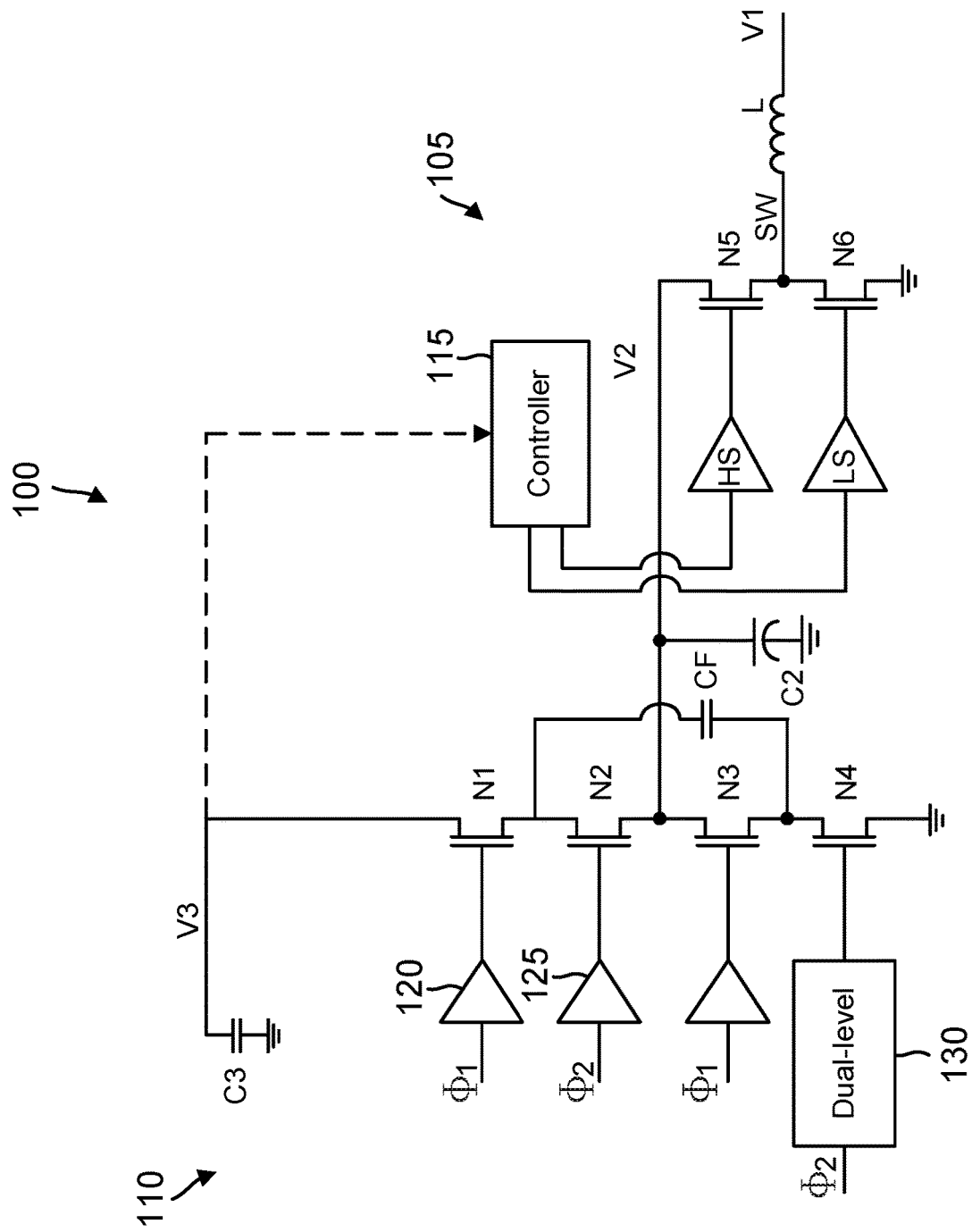
FIG. 1 is circuit diagram of a two-stage power converter in accordance with an aspect of the disclosure.

An example two-stage power converter 100 is shown in FIG. 1. A boost converter 105 converts an input voltage V1 into an intermediate voltage V2 using an inductor L, an NMOS high-side switch transistor N5, and an NMOS low-side switch transistor N6. Depending upon an output voltage V3, a controller 115 regulates the switching of switch transistors N5 and N6 through a high-side (HS) driver and a low-side (LS) driver. Boost converter 105 also includes an output capacitor C2 for supporting the intermediate voltage V2. Depending upon the output voltage V3, controller 115 may adjust a pulse-width modulation (PWM) or a pulse frequency modulation (PFM) of switch transistors N5 and N6 as known in the DC-DC switching power converter arts.

A charge pump 110 converts the intermediate voltage V2 into the output voltage V3. Charge pump 110 includes a first NMOS switch transistor N1, a second NMOS switch transistor N2, a third NMOS switch transistor N3, and a fourth NMOS switch transistor N4 all arranged in series. A flying capacitor CF connects between a drain of switch transistor N4 to a drain of switch transistor N2. The intermediate voltage V2 is received at the drain of switch transistor N3 (as well as the source of switch transistor N2). During normal operation, the switch transistors are driven in a fifty percent duty cycle. In a first switching phase φ1, switch transistors N1 and N3 are closed whereas switch transistors N4 and N2 are open. During this phase φ1, the flying capacitor CF discharges to drive the output voltage V3. A second switching phase φ2 is the complement of phase φ1 such that switch transistors N1 and N3 are open whereas switch transistors N2 and N4 are closed. During this phase φ2, the flying capacitor CF is charged by the intermediate voltage V2. In normal operation, the 50:50 alternation between the switching phases drives the output voltage V3 to be twice the intermediate voltage V2.

In normal operation, the switched-on switched transistors have their gate voltage driven such that the conduction occurs in the triode region of operation. For example, during the switching phase φ1, a driver 120 drives the gate voltage of switch transistor N1 so that switch transistor N1 is fully on in the triode mode (its least resistive conductive state). Similarly, during the switching phase φ2, a driver 125 drives the gate voltage of switch transistor N2 so that switch transistor N2 is fully on in the triode mode. During normal operation, the same drive occurs for switch transistor N4 as controlled by a driver 130. But during bypass transition mode for switch phase φ2, driver 130 does not drive switch transistor N4 fully on in the triode mode but instead forces switch transistor N4 to conduct in the saturation mode so that its current is controlled. Driver 130 may thus be designated as a dual-level driver since it will charge the gate voltage of switch transistor N4 differently depending upon whether triode mode or saturation mode operation is desired. It is during switch phase φ2 in which the flying capacitor CF is soft charged by dual-level driver 130. In contrast, a conventional transition from bypass mode to regular operation produces a rapid, uncontrolled charging of the flying capacitor that causes a substantial perturbation of the output voltage V3. In contrast, the soft charging control of switch transistor N4 inhibits this perturbation so that the output voltage V3 is more tightly regulated during a transition from bypass mode to regular operation.

It will be appreciated that the soft-charge technique or control disclosed herein could alternatively be applied to switch transistor N2. During the transition from bypass mode to regular operation, the control of the soft charging of the flying capacitor may be conducted in an open-loop fashion. For example, driver 130 may drive switch transistor N4 to mirror the current conducted by a current source. As the current source current is increased, so would the corresponding current conducted during switch phase φ2 by switch transistor N4 such that the flying capacitor CF would be charged in a controlled fashion. Alternatively, a quasi-closed-loop control may be implemented by driver 130 so that switch transistor N4 conducts a current proportional to either the load current (or the inductor current) and/or the output voltage V3. In this fashion, as the output voltage and/or load current increases, the flying capacitor charging is increased accordingly. Alternatively, a closed-loop control may be implemented by driver 130 so that a feedback loop controls the current through switch transistor N4 responsive to the flying capacitor voltage. In this fashion, the flying capacitor voltage is directly regulated and can be controlled to increase in a desired fashion.

The following discussion concerns the transition from bypass mode to regular operation. Analogous current control may be implemented during the transition from regular operation to the bypass mode. In addition, the following discussion will be directed to embodiments in which the flying capacitor is re-purposed during bypass mode so that it is in parallel with capacitors C2 and C3. Such an arrangement advantageously increases the output capacitance for boost converter 105 during the bypass mode. However, it will be appreciated that the flying capacitor can instead simply float during the bypass mode.

Figure 2:
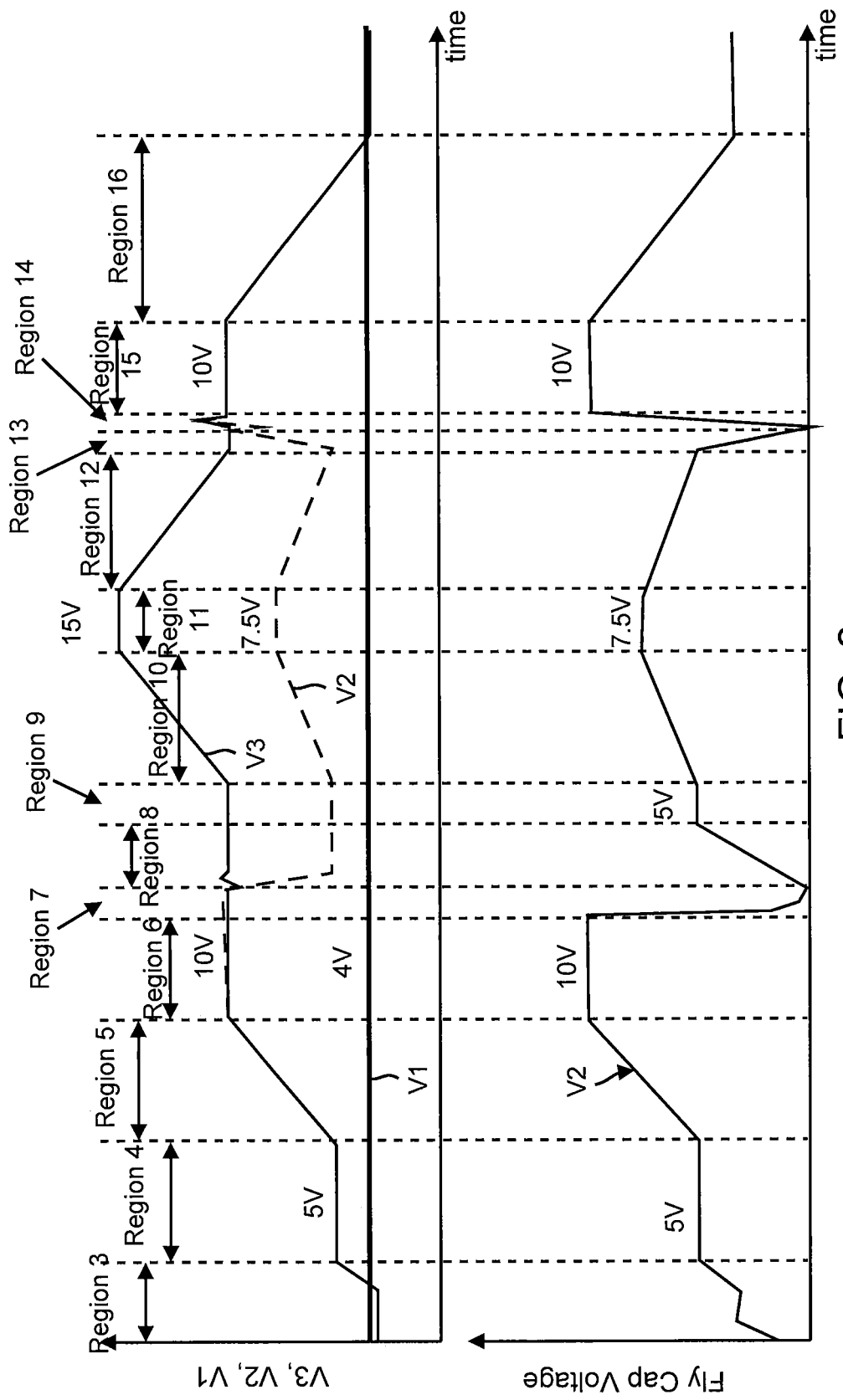
FIG. 2 illustrates some operating waveforms for the two-stage power converter of FIG. 1.

FIG. 2 illustrates some waveforms for the input voltage V1, the intermediate voltage V2, the output voltage V3, and the flying capacitor voltage during operation of two-stage converter 100. During an initial phase of operation designated as region 3, boost converter 105 begins boosting the output voltage V3 from its starting state of being equal to the input voltage V1. Operation begins in bypass mode so that charge pump 110 is not boosting output voltage V3 with respect to intermediate voltage V2. In this embodiment, the input voltage is approximately 4V. Depending upon the control of the low-side and high-side switch transistors N5 and N6, the output voltage V3 may be boosted solely by boost converter 105 to the regulation limits for boost converter 105. For example, during a subsequent phase of operation designated as region 4, the output voltage V3 is maintained constant at 5 V. The output voltage V3 is then increased linearly during another phase of operation designated as region 5 until it reaches 10 V. The output voltage V3 is then maintained constant at 10 V during a phase of operation designated as region 6.

Figure 3:
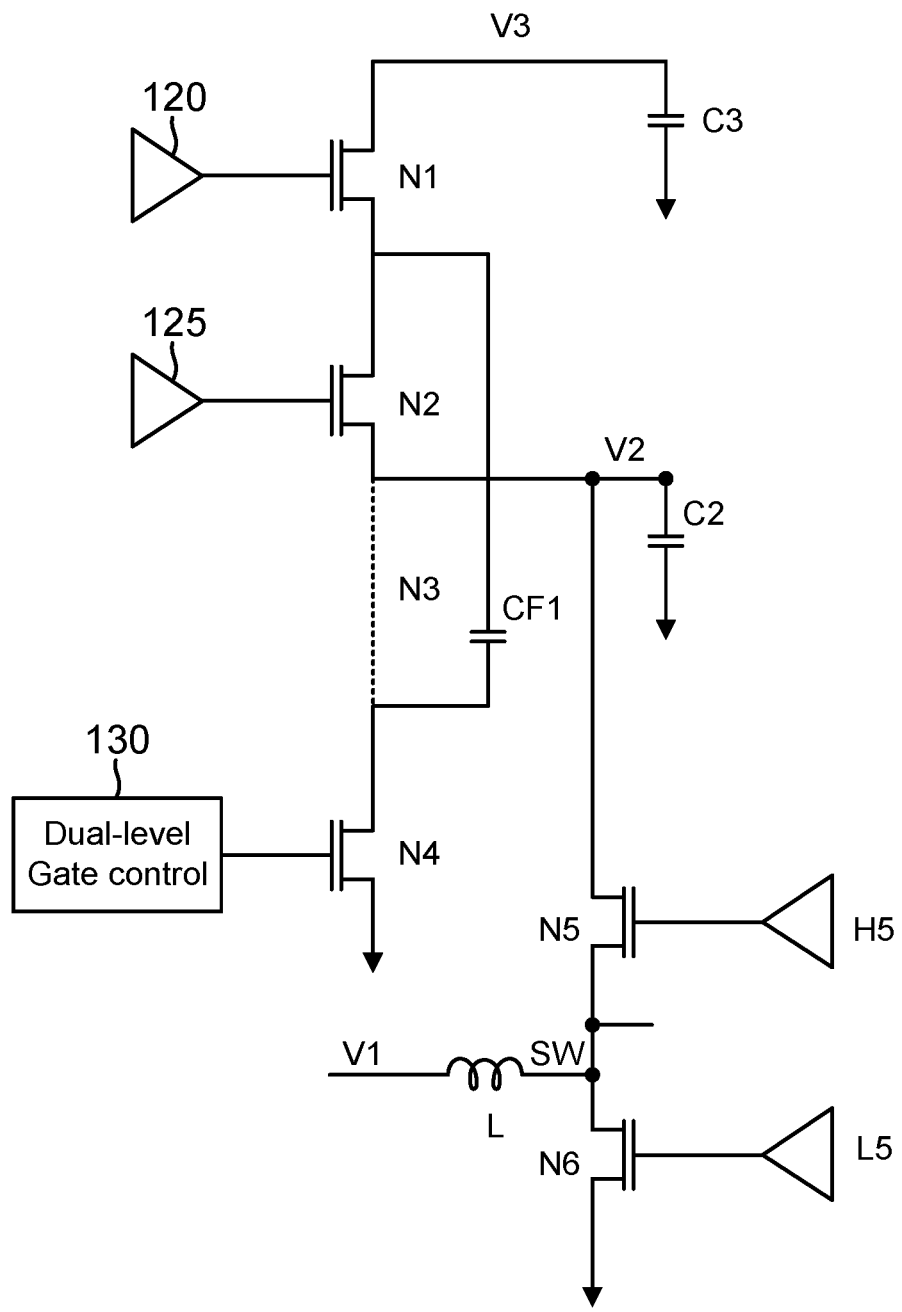
FIG. 3 illustrates the conduction path in the two-stage power converter of FIG. 1 during a bypass mode of operation in which the flying capacitor is reconfigured to serve as an output capacitor for the boost converter.

Operation in regions 3 through 6 all occurs in bypass mode. During bypass mode, the switch configuration is as shown in FIG. 3. Switch transistors N1 and N2 are maintained fully on by their respective drivers 120 and 125. Switch transistor N3 is not shown for illustration clarity since it is maintained off. Dual-level driver 130 maintains switch transistor N4 fully on. Flying capacitor CF1 is thus arranged in parallel with capacitors C2 and C3 with respect to ground and an output node for the output voltage V3. Controller 115 is not shown for illustration clarity, but it would control the high-side (HS) and low-side drivers so that boost converter operation would drive the output voltage to the desired level (assuming that this desired level is within the capabilities of boost converter 105).

Figure 4:
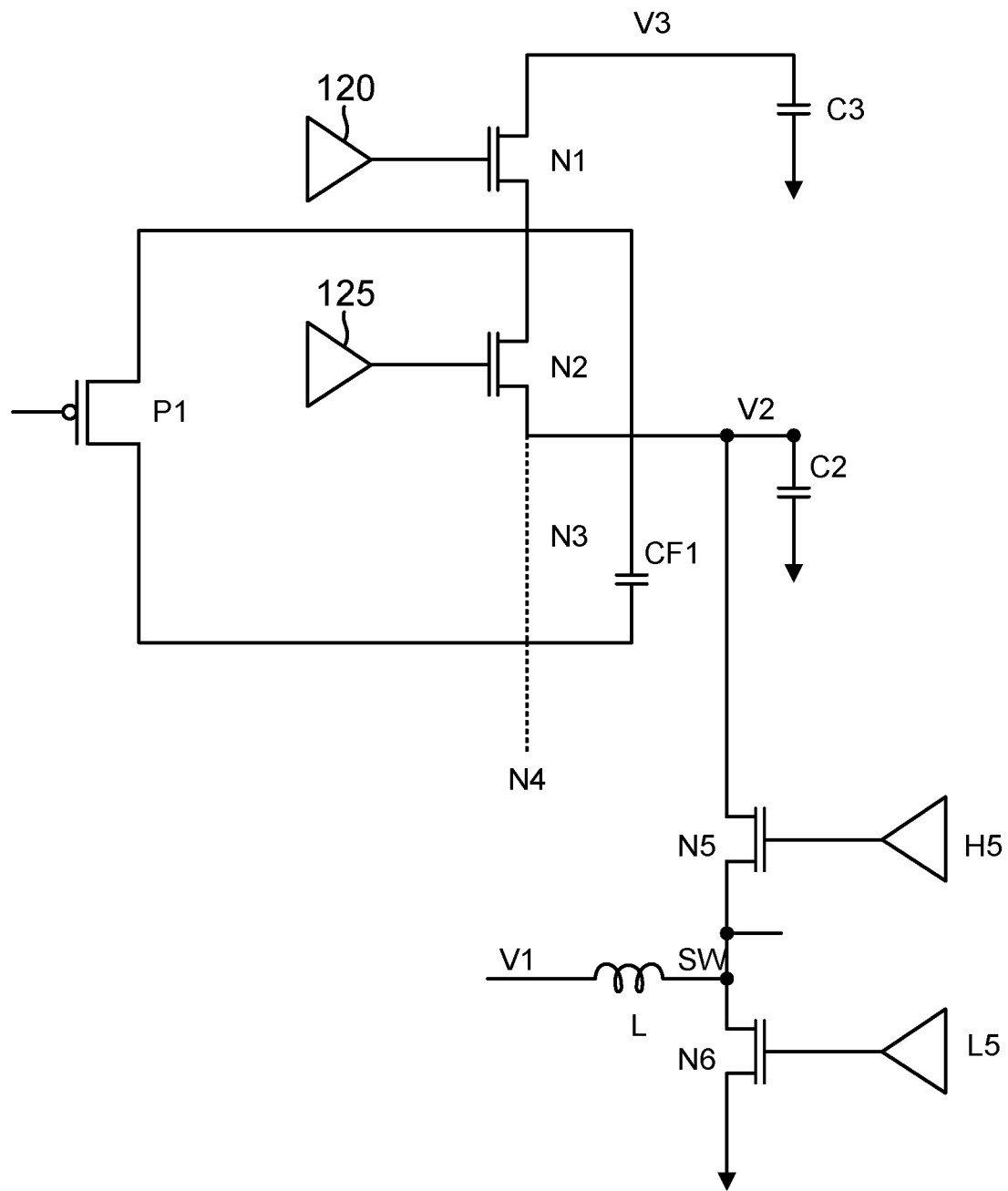
FIG. 4 illustrates the conduction path in the two-stage power converter of FIG. 1 during a bypass mode of operation in which the flying capacitor is discharged.

But boost converter 105 alone can only drive the output voltage V3 to 10 V in this example. To obtain greater output voltage levels requires regular operation in which charge pump 110 increase the intermediate voltage V2 by a factor of two. Referring again to FIG. 2, the transition to regular operation begins in a phase of operation designated as region 7. During this phase, the flying capacitor voltage drops from 10 V to some discharged state so that charge pump 105 may begin operation without substantially perturbing the output voltage V3. The resulting states for the transistors is shown in FIG. 4. To discharge the flying capacitor CF1; switch transistor N4 is switched off (for illustration clarity, transistor N4 is thus not shown in FIG. 4). Switch transistor N3 is maintained off. Switch transistors N1 and N2 are maintained on as also shown in FIG. 3 so that boost converter 105 can drive the output voltage V3 in the bypass mode. To discharge the flying capacitor voltage, a transistor such as a PMOS transistor P1 that is coupled in parallel with the flying capacitor CF1 is switched on. Depending upon the duration of the region 7 operation, the flying capacitor voltage will discharge to ground. However, in other embodiments, it may instead be discharged to a some relatively-low voltage such as 0.5 V.

With the flying capacitor voltage discharged, charge pump 110 may commence operation during which the flying capacitor voltage is soft charged as controlled by dual-level driver 130. Referring again to FIG. 2, the soft-charge phase is designated as region 8. During this phase, the flying capacitor voltage rises from its discharged state to one-half of the output voltage V3, which in this embodiment is 10 V for region 8 operation. The flying capacitor voltage will thus rise to 5 V. It will be appreciated, however, that these voltage levels are arbitrary and can be altered as desired in alternative embodiments. Charge pump 110 is active during the soft-charge phase so that switch transistors N1 and N3 are on during switch phase φ1 whereas switch transistors N2 and N4 are on during switch phase φ2. However, as noted earlier, dual-driver 130 does not drive switch transistor N4 fully on into the triode mode of operation during the soft-charge phase. Instead, dual-driver 130 controls switch transistor N4 during the phase φ2 to only conduct a controlled amount of current in saturation mode.

Figure 5:
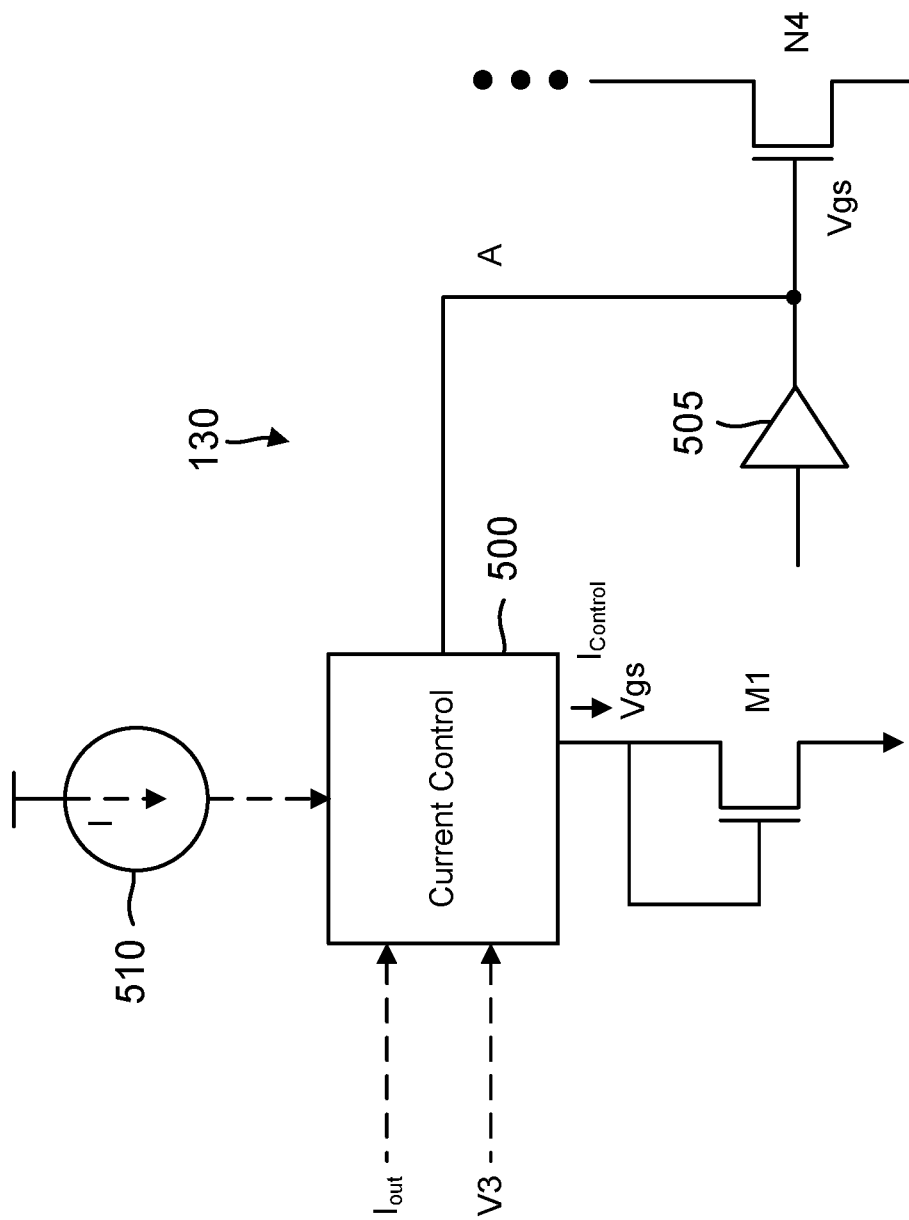
FIG. 5 illustrates a dual-level driver for the charge pump in the two-stage power converter of FIG. 1 in accordance with an aspect of the disclosure.

As noted earlier, this control of the current conducted by switch transistor N4 may be performed in an open-loop fashion or in a closed-loop fashion. An open-loop embodiment for dual-driver 130 is shown in FIG. 5. A current control circuit 500 drives a current Icontrol into the drain and gate of a diode-connected NMOS transistor M1 having a source connected to ground. Depending upon the current Icontrol, transistor M1 will develop a certain gate-to-source voltage Vgs. In a classic current mirror configuration, the gate of transistor M1 could simply be tied to the gate of switch transistor N4 so that current control circuit 500 could control the current conducted during the soft-charge phase. But switch transistor N4 must also be driven by a conventional driver 505 during normal operation so current control circuit 500 replicates the gate voltage of transistor M1 onto an output node A that is coupled to the gate of switch transistor N4. Since transistor M1 and switch transistor N4 will then have the same (or approximately the same) gate-to-source voltage, switch transistor N4 will mirror the current Icontrol depending upon the relative sizes of transistor M1 and switch transistor N4. If these transistors are matched, the current scaling is 1:1 whereas it would vary if the size ratio is varied.

As noted earlier, the open-loop control of the current conducted by switch transistor M4 during the soft-charge phase may be proportional to the output current Iout (note that this proportionality may be implemented through a proportionality to the average current through inductor L in some embodiments). Current control circuit 500 may thus generate the current Icontrol responsive to the output current Iout. The relationship between Icontrol and the output current Iout may be linear or may be non-linear. Similarly, current control 500 may generate the output current responsive to the output voltage V3 in either a linear or non-linear fashion. To provide additional assurance that the flying capacitor voltage will charge at a sufficiently fast yet controlled rate, current control circuit 500 may also generate the current Icontrol responsive to a current I1 from a current source 510. The control by current control circuit 500 may be to any one, two, or all three of these factors Iout, V3, and I1.

Figure 6A:
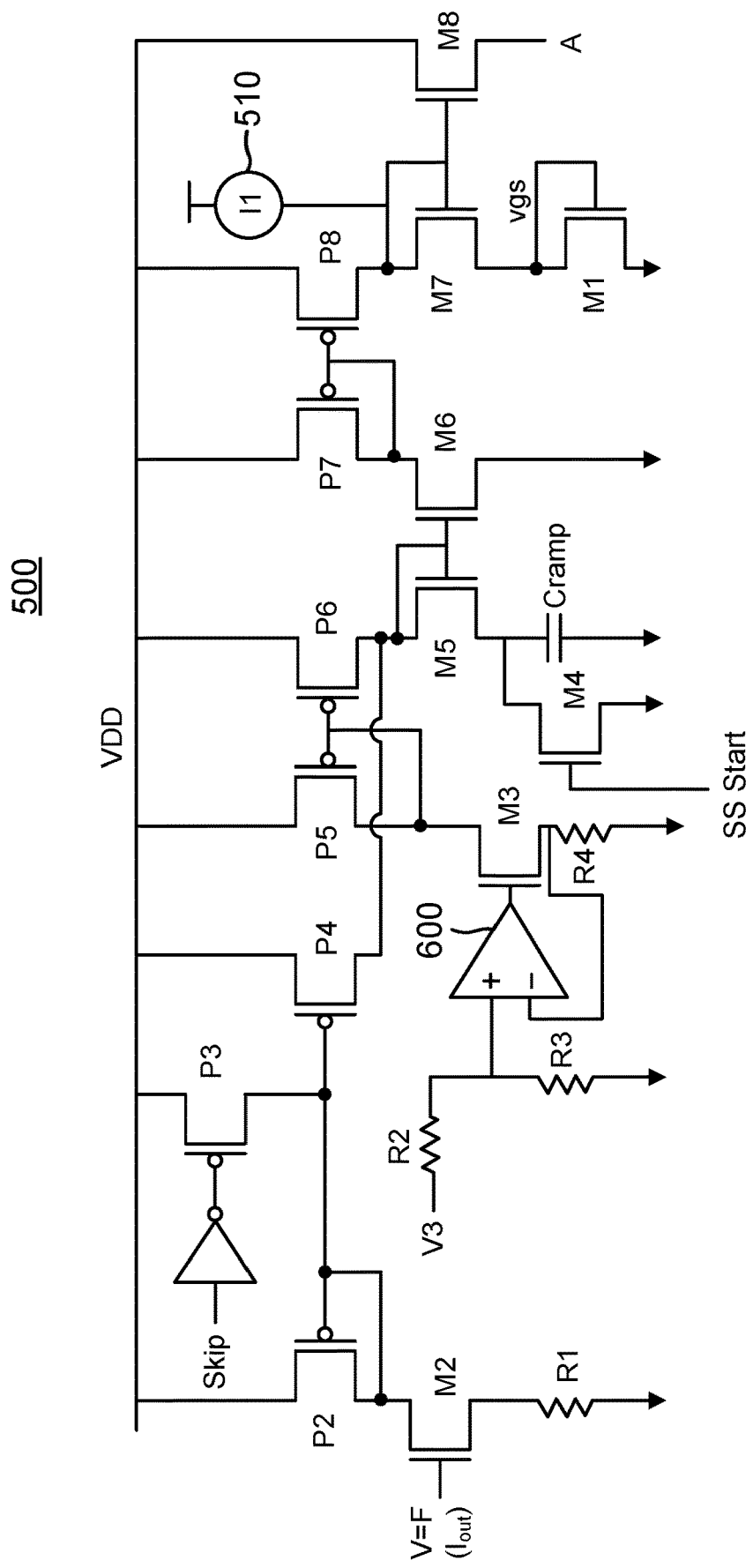
FIG. 6A is a circuit diagram of the current control circuit in the dual-level driver of FIG. 5 in accordance with an aspect of the disclosure.

An embodiment in which current control circuit 500 responds to all three factors is shown in FIG. 6A. An NMOS transistor M2 conducts a current into a resistor R1 responsive to a voltage that is a function of the output current Iout. The current conducted by transistor M2 will thus be a function of the output current Iout. Transistor M2 is in series with a diode-connected PMOS transistor P2 so transistor P2 will conduct the same current. Transistor P2 is in a current mirror configuration with a PMOS transistor P4. A gate voltage of transistor P4 is selectively charged high to the power supply voltage VDD through the action of a PMOS transistor P3 as controlled by a skip signal. Transistor P4 is thus off if the skip signal is asserted. But during normal operation and the bypass mode of operation, the skip signal is grounded so that transistor P3 is off. Transistor P4 will thus conduct a current that is a function of the output current Iout during normal operation.

The output voltage V3 couples through a voltage divider formed by a pair of resistors R2 and R3 to a non-inverting input of a differential amplifier 600 that drives a gate of an NMOS transistor M3 having a source tied to ground through a resistor R4. The source of transistor M3 connects to the negative input of differential amplifier 600. Feedback through differential amplifier 600 will thus keep the source voltage for transistor M3 equal to the divided version of the output voltage V3 as divided through the voltage divider. Transistor M3 will thus conduct an output-voltage-related current that is a function of the output voltage V3. The drain of transistor M3 connects to a drain and gate of a diode-connected PMOS transistor P5 that is in a current mirror configuration with a PMOS transistor P6. Transistor P6 will thus conduct a mirrored version of the output-voltage-related current conducted by transistors M3 and P5.

The drains of transistors P4 and P6 are connected to the gate and drain of a diode-connected NMOS transistor M5. Transistor M5 will thus conduct a combined current that is a sum of the output-current-related current conducted by transistor P4 and the output-voltage-related current conducted by transistor P6. The drain of transistor M5 couples to ground through a capacitor Cramp. As transistor M5 conducts during the soft-charge phase, a source voltage for transistor M5 will thus increase as the capacitor Cramp is charged. Prior to the soft-charge phase, capacitor Cramp is discharged through the action of an NMOS transistor M4 as controlled by a signal SS Start.

Transistor M5 has its gate connected to the gate of an NMOS transistor M6 having its source connected to ground. If the source of transistor M5 were grounded, transistors M5 and M6 would form a conventional current mirror. But due to the capacitor Cramp, the gate voltage for transistor M5 will increase during the soft-charge phase as capacitor Cramp charges. This increase in the gate voltage for transistor M5 is replicated by an increase in the gate voltage for transistor M6. The current through transistor M6 will thus equal a non-linear function (e.g., approximately a square) of the combined current through transistor M5. This non-linearity is helpful in increasing the rate of the charging of the flying capacitor voltage in a controlled fashion. However, it will be appreciated that a linear current mirror relationship may be used in alternative embodiments.

Transistor M6 is in series with a diode-connected PMOS transistor P7 that is in a current mirror configuration with a PMOS transistor P8. Transistor P8 will thus conduct a mirrored version of the nonlinearly-increased combined current conducted by transistor M6. Transistor P8 couples to ground through a diode-connected NMOS transistor M7 and diode-connected transistor M1. Current source 510 also drives the gate and drain of transistor M7. Transistor M1 will thus generate a gate-to-source voltage Vgs that is function of a sum of the nonlinearly-increased combined current conducted by transistor M6 and the current I1 conducted by current source 510. The gate-to-source voltage for transistor M1 is thus a function of all three factors discussed earlier: the output voltage V3, the output current Iout, and an additional current IL One of ordinary skill will readily appreciate that current control circuit 500 may be varied to use just one or two of these factors in alternative embodiments.

The gate voltage for transistor M7 will be a threshold voltage above the gate-to-source voltage Vgs for transistor M1. The gate of transistor M7 connects to an NMOS transistor M8 having its drain tied to the power supply node for the power supply voltage VDD. Transistor M8 is thus in a source-follower configuration such that its source voltage will follow its gate voltage minus the threshold voltage drop for transistor M8. The net effect of transistors M7 and M8 is thus to replicate the gate voltage (which in this case is the gate-to-source voltage Vgs) of transistor M1 at a node A at the source of transistor M8.

Figure 6B:
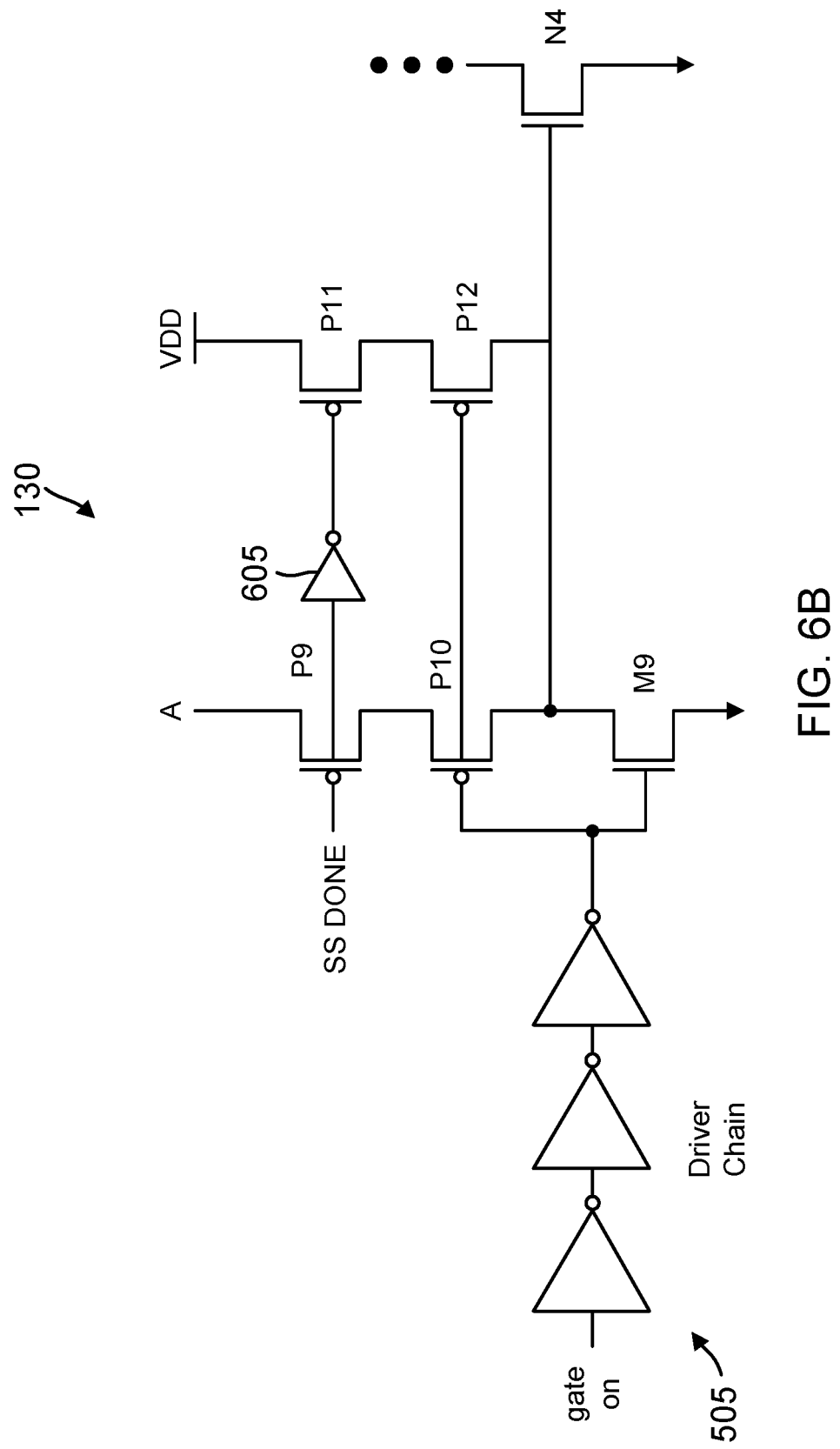
FIG. 6B is a circuit diagram for a remaining portion of the dual-level driver of FIG. 5 that receives an output voltage from the current control circuit of FIG. 6A in accordance with an aspect of the disclosure.

The remainder of dual-level driver 130 is shown in FIG. 6B. Node A connects to the source of a PMOS transistor P9 that has its drain connected to a source of a PMOS transistor P10. Conventional driver chain 505 drives the gate of transistor P10. During switch phase ϕ2, a gate on command is asserted to driver chain 500. Transistor P10 is thus on during switch phase ϕ2. The drain of transistor P10 connects to ground through an NMOS transistor M9 that also has its gate driven by the driver chain 505. Transistor M9 will thus be off during switch phase ϕ2. The drains of transistors M9 and P10 connect to the gate of switch transistor N4.

Driver chain 505 also drives the gate of a PMOS transistor P12 that has its drain connected to the gate of switch transistor N4. Transistor P12 will thus be switched on during phase ϕ2. The source of transistor P12 connects to the power supply node through a PMOS transistor P11 that is controlled by an inverted version of the SS done signal as inverted by an inverter 605. The SS done signal is low during the soft-charge phase and asserted high to end this phase. Transistor P11 will thus be off during the switch phase ϕ2. Since transistors P9 and P10 are on and transistor M9 is off during switch phase ϕ2, the replicated gate-to-source voltage Vgs for transistor M1 couples through node A to drive the gate of switch transistor N4. The flying capacitor CF will thus charge during the soft-charge mode responsive to current controlled by current control circuit 500.

When the SS done signal is asserted at the end of the soft-charge phase, transistor P9 is switched off to isolate node A from affecting the gate voltage for switch transistor N4. Transistor P11 is switched on so that transistors P12 and M9 form a final inverter for driver chain 505 during normal operation. Switch transistor N4 can thus be seamlessly controlled in either a conventional fashion during normal operation or as discussed herein for the soft-charge mode.

Figure 7:
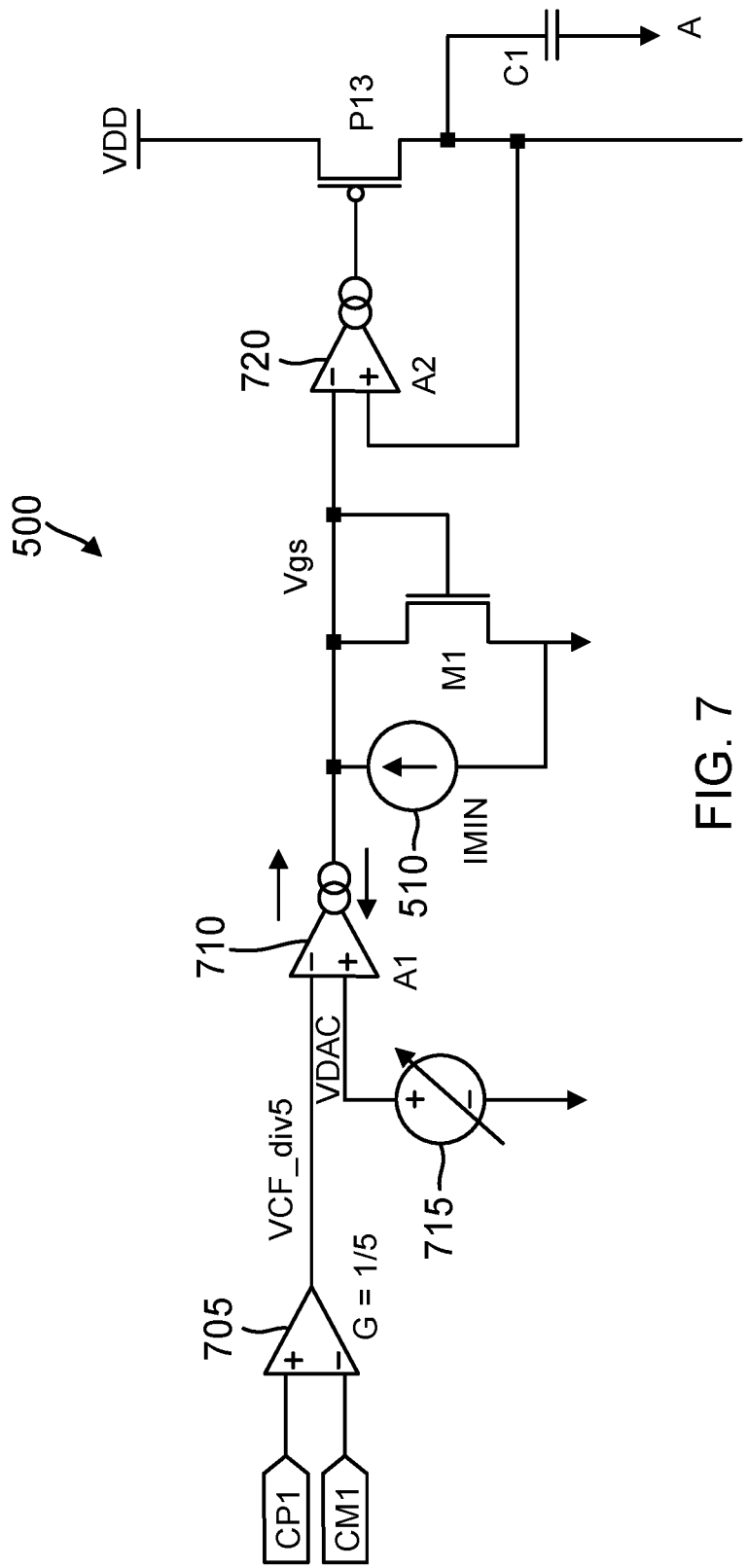
FIG. 7 is a circuit diagram of a closed-loop embodiment of the dual-level driver of FIG. 5 in accordance with an aspect of the disclosure.

In an alternative embodiment, dual-driver 130 may implement feedback in a closed-loop fashion to control the flying capacitor voltage. An example closed-loop current control circuit 500 is shown in FIG. 7. A difference amplifier 705 outputs a divided version of the flying capacitor voltage (VCF_div5) responsive to the difference between a positive terminal voltage CP1 for the flying capacitor CF1 and its negative terminal voltage CM1. A transconductance amplifier 710 either sources or draws an output current responsive to a difference between the divided capacitor voltage and a reference voltage such as an analog voltage VDAC from a digital-to-analog converter (DAC) 715. DAC 715 converts a digital control signal (not illustrated) that is varied so as to increase the analog voltage VDAC over the soft-charge phase. The output current from transconductance amplifier 710 drives the gate and drain of diode-connected transistor M1. Analogously as discussed with regard to FIG. 6A, current source 510 also drives a minimum current Imin into the data and drain of transistor M1. Transistor M1 will thus develop a gate-to-source voltage Vgs that is a function of the difference between the desired flying capacitor voltage as represented by the analog voltage VDAC and the divided flying capacitor voltage. A transconductance amplifier 720 drives a current into a gate of a PMOS transistor P13 responsive to a difference between the gate-to-source voltage Vgs for transistor M1 and a drain voltage for transistor P13. The drain of transistor P13 connects to node A that drives the remainder of dual-driver 130 as discussed with regard to FIG. 6B. Due to the feedback though transconductance amplifier 720, the drain voltage for transistor P13 (the voltage of node A) will equal the drain-to-source voltage Vgs for transistor M1. A capacitor C1 may be used to support the node A voltage.

Referring again to FIG. 2, the soft-charge phase in region 8 ends with the flying capacitor voltage at one-half the output voltage V3, which in this example is 10 V so that the flying capacitor voltage rises to 5 V. With the soft-charge phase completed, the control of the switching in boost converter 105 can drive the output voltage to a desired value. In FIG. 2, the output voltage stays at 10 V across a region 9 and this increases linearly in a region 10 to reach a maximum of 15 V. The output voltage stays at 15 V in a region 11. Note that the switching in charge pump 110 does not vary from region 8 through region 11. It is just the pulse-width-modulation (or pulse-frequency modulation) of the switching in boost converter 105 that will be varied to produce the desired output voltage V3. The intermediate voltage V2 is one-half of the output voltage V3 during normal operation since charge pump 110 functions to double the intermediate voltage V2 during its normal operation.

The control of the switching in boost converter 105 may also be used to drop the output voltage as beginning in a region 12. In this example, the output voltage V3 is dropped to 10 V. With the output voltage dropped sufficiently, the flying Capacitor voltage may be discharged as shown for a region 13. It will be appreciated that the charge pump 110 may be duplicated in an interleaved fashion such that one flying capacitor drives the output voltage in switch phase φ1 while the remaining flying capacitor is charged in switch phase φ2. To allow the flying capacitor voltage to discharge efficiently, switch phase φ2 is altered during operation in region 13 so that the flying capacitor in switch phase φ2 floats rather than being charged. The energy in the flying capacitor is thus not restored such that it continues to drop with each successive switch phase φ1 until the energy is sufficiently depleted. As discussed previously, this discharge may go to ground or to some relatively small voltage such as 0.5 V.

Figure 8:
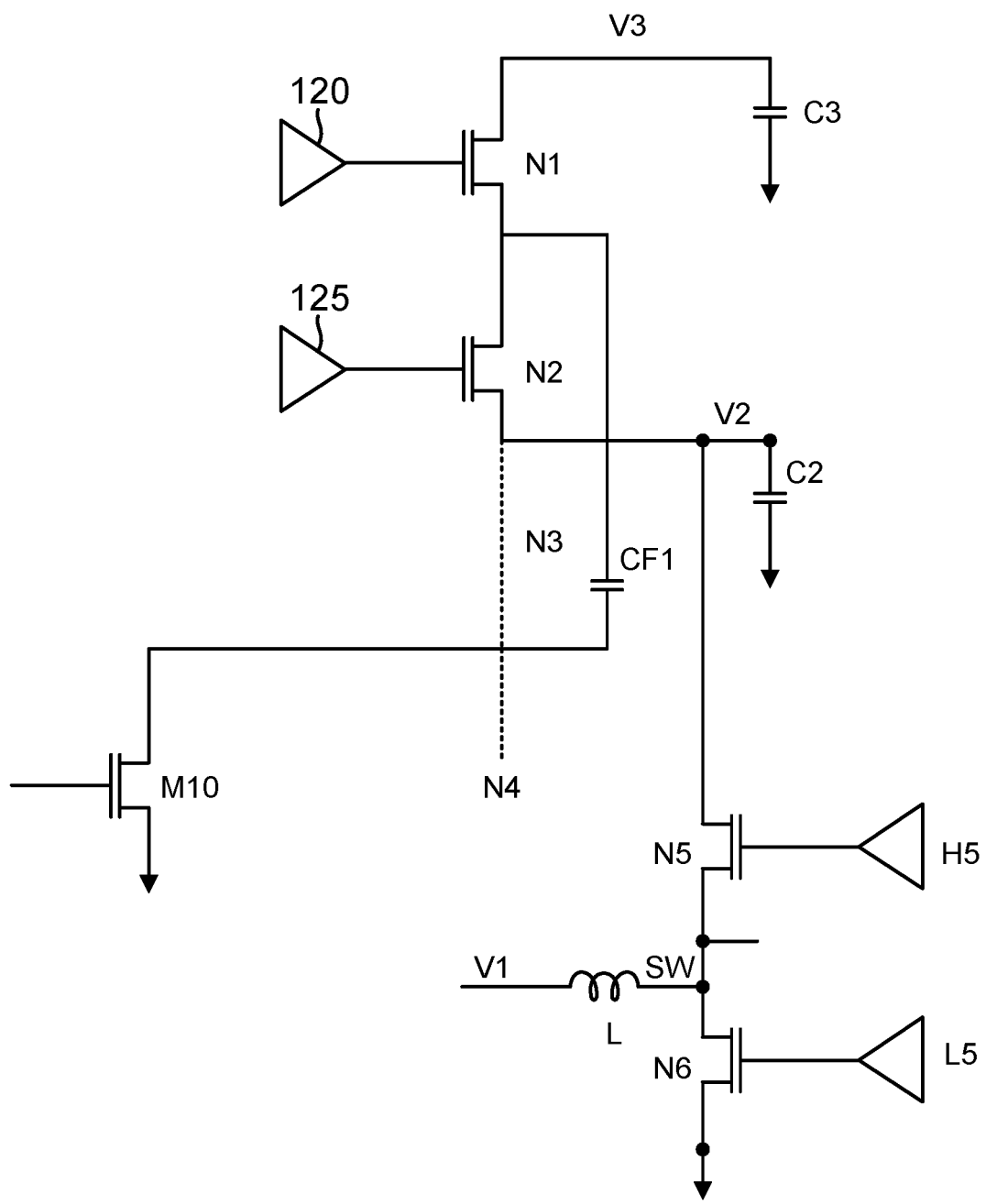
FIG. 8 illustrates a conduction path in the two-stage power converter of FIG. 1 during a transition into bypass mode of operation in which the flying capacitor is soft charged.

Operation in region 13 ends once the flying capacitor voltage is depleted sufficiently. The transition to bypass mode may then occur starting in a region 14. In one embodiment, the flying capacitor can simply float once the bypass mode begins following the discharge of the flying capacitor voltage. But as discussed earlier, it is advantageous to repurpose the flying capacitor to bolster the output capacitance for boost converter 105. The flying capacitor cannot simply be placed in parallel with capacitors C2 and C3 as bypass operation begins because such a reconfiguration of the flying capacitor will perturb the output voltage V3 undesirably. The flying capacitor voltage may thus be soft charged during operation in region 14 until the flying capacitor voltage is charged to the output voltage V3. This soft charging may occur using dual-driver 130 as discussed above in either an open-loop or a closed-loop embodiment. Alternatively, a relatively resistive transistor switch may be used to control the soft charging of the flying capacitor. An example switching configuration having such a resistive switch is shown in FIG. 8. Switch transistors N1 and N2 are on whereas switch transistors N3 and N4 are off. A relatively-small NMOS transistor M10 that couples between ground and the negative terminal for the flying capacitor CF1 is switched fully-on so that the flying capacitor voltage may begin to be charged by the output voltage V3. But due to the relatively small size of transistor M10, the charging of the flying capacitor voltage is sufficiently controlled so that no undesirable perturbation of the output voltage V3 is induced.

With the flying capacitor voltage charged to the output voltage V3, operation in a region 15 may begin. This bypass operation is as discussed with regard to regions 3 through 6. The control of the switching in boost converter 105 may then be adjusted to further lower the output voltage as shown in region 16.

Figure 9:
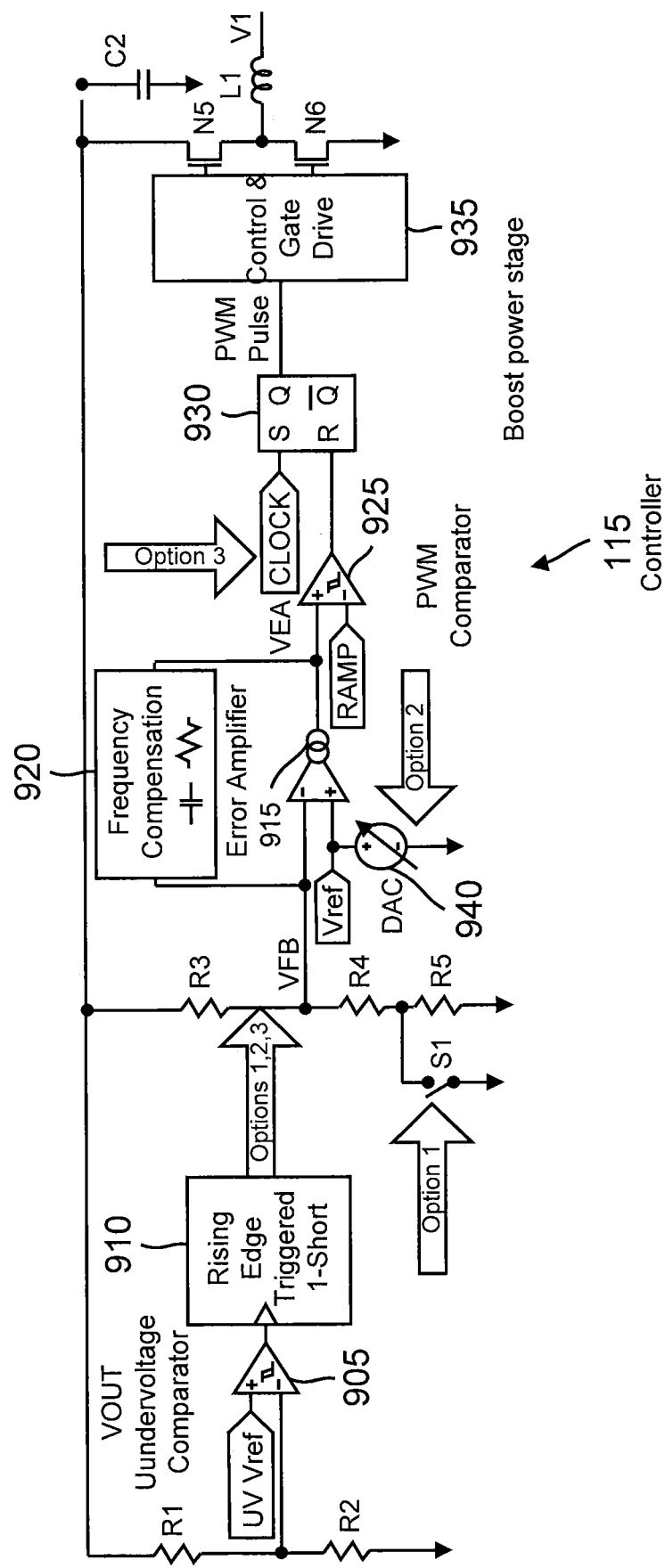
FIG. 9 is a circuit diagram of an embodiment for the controller of the boost converter of FIG. 1 in which the controller is configured to implement a transient response to undervoltage conditions for the output voltage.

Although the soft-charge discussed herein advantageously inhibits the perturbation of the output voltage V3, some minor disturbances may remain. Controller 115 may thus be configured to implement a transient reaction to address voltage undershoots and overshoots. The following discussion will focus on the reaction to voltage undershoots but it will be appreciated that a similar technique may be used to address voltage overshoots. An example controller 115 configured to implement a transient reaction to voltage undershoots is shown in FIG. 9. To obtain feedback on the output voltage V3, a voltage divider formed by a pair of resistors R1 and R2 divides the intermediate voltage V2. Alternatively, the output voltage V3 itself may be divided but it is equivalent to divide the intermediate voltage V2 since it and the output voltage V3 are either equal (during the bypass mode) or have a 1:2 relationship (during normal operation). An undervoltage comparator 905 compares an undervoltage reference value (UV Vef) to the divided voltage. Should the divided voltage drop below the undervoltage reference value, comparator 905 triggers a one-shot circuit 910.

As known in the one-shot circuit arts, one-shot circuit 910 pulses an output signal for a relatively short duration in response to the triggering by comparator 905. The duration of the one-shot period may be used to alter the pulse-width modulation of the high and low-side switch transistors N5 and N6 in boost converter 105. After the one-shot period is ended, controller 115 returns to its default modulation. There are several ways to boost the gain of controller 115. For example, during default operation, controller 115 senses the intermediate voltage V2 using a voltage divider formed by resistors R3, R4, and R5 to obtain a feedback voltage VFB. A switch S1 couples across resistor R5. During the one-shot period, switch S1 may be closed to short out resistor R5 and reduce the voltage division applied by the voltage divider. This reduces the feedback voltage VFB.

Controller 115 includes an error amplifier 915 that amplifies a difference between a reference voltage Vref and the feedback voltage VFB. The temporary reduction in the feedback voltage VFB thus temporarily increases an error voltage (VEA) produced by error amplifier 915. Error amplifier 915 is frequency compensated by a loop filter 920. A PWM comparator 925 compares the error voltage to a ramp signal (RAMP) to reset a set-reset (SR) latch 930. A clock signal (CLOCK) that determines the period for the pulse-width modulation sets the SR latch. The Q output of SR latch 930 is processed by a gate driver 935 so that the high-side and low-side switch transistors N5 and N6 may be cycled accordingly. The temporary boosting of the error voltage thus provides a temporary boost to the duty cycle for the pulse-width modulation of the cycling of the high-side and low-side switch transistors N5 and N6.

Alternatively (or in combination with the voltage division change), a digital word (not illustrated) that is converted by a digital-to-analog converter (DAC) 940 may be temporarily changed to boost the reference voltage VREF. This boosting of the reference voltage VREF increases the duty cycle for the pulse-width modulation to assist the recovery of the output voltage V3 from the undervoltage condition.

As another alternative (or in combination with one or both of the voltage division and reference voltage changes), the frequency of the clock signal may be increased. Such a change in frequency increases the switching frequency of the high-side and low-side switch transistors N5 and N6, which in turn allows the inductor L1 to provide more current to the load while the boost is operating at the maximum duty cycle. Note that energy delivery to the load from boost converter 105 occurs only while the inductor L1 demagnetizes. During maximum duty cycle operation, the demagnetizing interval is relatively short but has a minimum off-time requirement. The increase in switching frequency thus causes more energy delivery to the load since each switching cycle has a mandatory interval of demagnetization. In lieu of increasing the switching frequency, the minimum off-time for the switching of switch transistors N5 and N6 could be temporarily decreased.

Those of some skill in this art will by now appreciate that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A two-stage power converter, comprising:
   a boost converter configured to boost an input voltage into an intermediate voltage; and
   a charge pump including a flying capacitor and a plurality of switch transistors, wherein the charge pump is configured to boost the intermediate voltage into an output voltage during a normal mode of operation, and wherein the charge pump is further configured to pass the intermediate voltage as the output voltage during a bypass mode of operation, and wherein the charge pump further includes:
   a dual-level driver including a diode-connected transistor and a current control circuit configured to control a first current conducted by the diode-connected transistor during a first transition mode of operation from the bypass mode of operation to the normal mode of operation, wherein the current control circuit is further configured to control a first switch transistor from the plurality of switch transistors to conduct a current proportional to the first current during the first transition mode of operation.

2. The two-stage power converter of claim 1, wherein the diode-connected transistor has a source connected to ground, and wherein the first switch transistor also has a source connected to ground.

3. The two-stage power converter of claim 1, wherein the current control circuit is further configured to control the first switch transistor to conduct in a triode mode during the normal mode of operation.

4. The two-stage power converter of claim 1, wherein the current control circuit is further configured to control the first current responsive to the output voltage.

5. The two-stage power converter of claim 1, wherein the current control circuit is further configured to control the first current responsive to an output current for the two-stage power converter.

6. The two-stage power converter of claim 1, wherein the current control circuit is further configured to control the first current responsive to a current from a current source.

7. The two-stage power converter of claim 5, wherein the current control circuit is further configured to control the first current responsive to a nonlinear function of the output voltage.

8. The two-stage power converter of claim 2, wherein the current control circuit comprises:
   a first error amplifier configured to drive a gate and a drain of the diode-connected transistor responsive to a difference between a voltage across the flying capacitor and a reference voltage;
   a source-follower transistor; and
   a second error amplifier configured to drive a gate of the source-follower transistor responsive to a difference between a source voltage for the source-follower transistor and a gate voltage for the diode-connected transistor, wherein a source for the source-follower transistor is coupled to a gate of the first switch transistor during the bypass mode of operation.

9. The two-stage power converter of claim 8, wherein the current control circuit further comprises a digital-to-analog converter configured to provide the reference voltage.

10. The two-stage power converter of claim 1, wherein the charge pump is further configured to couple the flying capacitor in parallel with an output capacitor for the boost converter during the bypass mode of operation.

11. The two-stage power converter of claim 1, wherein the charge pump is further configured to alternate between a first switching phase and a second switching phase during a second transition mode of operation from the normal mode of operation to the bypass mode of operation, wherein the flying capacitor is configured to discharge to the output voltage during the first switching phase and to float during the second switching phase.

12. The two-stage power converter of claim 11, wherein the charge pump is further configured to couple the flying capacitor to ground through a charging transistor during an initial portion of the bypass mode of operation following the second transition mode operation.

13. The two-stage power converter of claim 12, wherein the charging transistor is smaller than the first switch transistor.

14. The two-stage power converter of claim 1, wherein the dual-level driver includes a driver chain configured to drive the first switch transistor into a triode mode of conduction during the normal mode of operation.

15. The two-stage power converter of claim 1, wherein the boost converter includes a controller configured to control a pulse width modulation of a high-side switch and a low-side switch responsive to the output voltage during the bypass mode of operation and the normal mode of operation.

16. The two-stage power converter of claim 15, wherein the controller comprises:
   an error amplifier configured to drive an error signal responsive to a difference between the output voltage and a reference voltage, wherein the controller is further configured to temporarily increase the reference voltage in response to an undervoltage condition for the output voltage.

17. The two-stage power converter of claim 16, wherein the controller comprises:
   a voltage divider configured to divide the output voltage into a divided voltage according to a voltage divider ratio; and
   an error amplifier configured to drive an error signal responsive to a difference between the divided voltage and a reference voltage, wherein the controller is further configured to temporarily decrease the voltage divider ratio in response to an undervoltage condition for the output voltage.

18. The two-stage power converter of claim 16, wherein the controller comprises:

an error amplifier configured to drive an error signal responsive to a difference between the output voltage and a reference voltage;

a reset-set latch;

a clock source configured to generate a clock signal, wherein the reset-set latch is configured to set responsive to the clock signal;

a pulse-width modulator comparator configured to compare the error signal to a ramp signal to generate a comparator output signal, wherein the reset-set latch is configured to reset responsive to the comparator output signal, and wherein the controller is further configured to temporarily increase a frequency of the clock signal in response to an undervoltage condition for the output voltage.

19. A method for a two-stage power converter; comprising:

during a bypass mode of operation, converting an input voltage in a boost converter into an intermediate voltage and passing the intermediate voltage though a charge pump as an output voltage;

during a transition mode of operation out of the bypass mode of operation, controlling a current conducted by a first switch transistor coupled to a flying capacitor in the charge pump responsive to a first current conducted by a diode-connected transistor to charge a voltage for the flying capacitor; and during a normal mode of operation following the bypass mode of operation, cycling the first switch transistor in the charge pump so that the output voltage is greater than the intermediate voltage.

20. The method of claim 19, further comprising:

arranging the flying capacitor to be in parallel with an output capacitor for the boost converter during the bypass mode of operation.

* * * * *